(12) United States Patent
Chan et al.

(10) Patent No.: US 6,696,761 B2
(45) Date of Patent: Feb. 24, 2004

(54) METHOD TO ENCAPSULATE COPPER PLUG FOR INTERCONNECT METALLIZATION

(75) Inventors: Lap Chan, San Francisco, CA (US); Sam Fong Yau Li, Singapore (SG); Hou Tee Ng, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/785,108

(22) Filed: Feb. 20, 2001

(65) Prior Publication Data

US 2004/0009664 A1 Jan. 15, 2004

Related U.S. Application Data

(62) Division of application No. 09/196,604, filed on Nov. 20, 1998, now Pat. No. 6,214,728.

(51) Int. Cl.⁷ .......................... H01L 23/48; H01L 23/52; H01L 29/40
(52) U.S. Cl. ........................................ 257/762; 257/763
(58) Field of Search ................................. 257/762, 763, 257/764, 765, 774

(56) References Cited

U.S. PATENT DOCUMENTS

| | | |
|---|---|---|
| 4,282,271 A | 8/1981 | Feldstein ..................... 427/98 |
| 5,470,789 A | 11/1995 | Misawa ....................... 437/190 |
| 5,674,787 A | 10/1997 | Zhao et al. .................. 437/230 |
| 5,824,599 A * | 10/1998 | Schacham-Diamand et al. ........................... 438/678 |
| 5,898,222 A * | 4/1999 | Farooq et al. ............... 257/762 |
| 6,147,408 A * | 11/2000 | Ogure et al. ................. 257/762 |
| 2002/0004302 A1 * | 1/2002 | Fukumoto .................... 438/689 |

* cited by examiner

*Primary Examiner*—Phat X. Cao
(74) *Attorney, Agent, or Firm*—George O. Saile; Rosemary L. S. Pike; Graham S. Jones, II

(57) ABSTRACT

An encapsulated copper plug on a doped silicon semiconductor substrate has a substrate surface, covered with insulation, with a plug hole with a diffusion barrier formed on the walls and the bottom of the hole to the top of the hole. The plug hole is partially filled with an electrolessly deposited copper metal plug. An encapsulating metal deposit caps the plug without any intervening oxidation and degradation. In a transition from copper to a codeposit of copper, an encapsulating Pt, Pd, and/or Ag metal deposits in the electroless bath without oxidation and degradation followed by a pure deposit of the encapsulating metal layer to cap the plug. The surface of the encapsulating metal deposit is formed by overgrowth above the plug hole followed by polishing the surface of the insulator layer removing the overgrowth of the metal layer polished by a CMP process to planarize the surface of the insulator layer which is the top surface of device to achieve coplanarity of metal layer with the topography of the insulator layer.

8 Claims, 1 Drawing Sheet

METHOD TO ENCAPSULATE COPPER PLUG FOR INTERCONNECT METALLIZATION

This is a division of patent application Ser. No. 09/196,604, filing date Nov. 20, 1998, U.S. Pat. No. 6,214,728, Method To Encapsulate Copper Plug For Interconnect Metallization, assigned to the same assignee as the present invention.

BACKGROUND OF THE INVENTION

1. Field of the Invention

This invention relates to interconnection structures for silicon semiconductor devices and more particularly to methods and apparatus for forming conductive plugs serving as contacts or via connections.

2. Description of Related Art

U.S. Pat. No. 5,674,787 of Zhao et al. for "Selective Electroless Copper Deposited Interconnect Plugs for ULSI Applications" shows selective electroless deposition of copper in a via hole using a seed layer. An electroless copper (Cu) deposition method selectively forms encapsulated copper plugs to connect conductive regions of a semiconductor device. A contact displacement technique forms a thin activation copper layer on a barrier metal layer, e.g. TiN, which covers the underlying metal layer. Copper is deposited in the via by an electroless auto-catalytic process. Electroless copper deposition continues until the via is almost filled which leaves sufficient room at the top for an upper encapsulation to be formed there, but first the device is rinsed in DI water to remove the electroless deposition solution. Then after the rising away of the electroless copper solution, a cap barrier layer, from 500 Å to about 1500 Å thick, is formed of a variety of metals or metal alloys such as Ni, Co, Ni—Co alloy, CoP, NiCoP, or NiP from another electroless solution. Sidewalls of SiN or SiON, the bottom barrier layer and the cap barrier layer complete the full encapsulation of the copper plug via.

U.S. Pat. No. 5,470,789 of Misawa for "Process for Fabricating Integrated Circuit Devices" produces TiN/Cu (titanium nitride/copper) wiring and contact layers each having a capping layer formed of TiN unlike the Pt, Pd, or Ag cap layer of this invention.

U.S. Pat. No. 4,282,271 of Feldstein for "Dispersions for Activating Non-Conductors for Electroless Plating" shows an electroless deposition technique.

SUMMARY OF THE INVENTION

Alternative metallization metal that is capable of delivering better (1) conductivity and (2) minimizing electromigration is implemented in a design in accordance with this invention. Copper is very much envisaged to be the future metal for interconnect metals in vias and contacts since it meets the above two important criteria. Moreover, deposition of copper by the electroless method seems to be an attractive approach based upon factors such as cost of ownership, simplicity of the process and void-free filling capability. However, copper is very prone to oxidation and degradation unless proper treatment is carried out after deposition. Such oxidation and degradation adversely affect the overall performance of devices.

In accordance with this invention, a method is provided for forming a copper plug on a doped silicon semiconductor substrate having a substrate surface which is covered with an insulation layer which comprises the following steps. Form a plug hole in the insulation layer down to the substrate surface, which plug hole has walls and a bottom comprising a portion of the substrate surface. Form a diffusion barrier on the walls and the bottom of the hole. Partially fill the plug hole with a copper metal deposit to a predetermined depth which is less than the depth "h" of the hole leaving a space in the plug hole above the copper metal deposit. Deposit an encapsulating metal layer on the surface of the copper metal deposit including an overgrowth above the plug hole, and then polish the surface of the insulator layer removing the overgrowth of the metal layer to planarize the surface of the insulator layer which is the top surface of device to achieve coplanarity of metal layer with the topography of the insulator layer.

Preferably, the copper metal deposit is plated in an enclosed environment, such as a plating process which preferably employs an electroless plating bath. After the predetermined depth been reached, the plating continues, gradually switching the constituents in the bath from copper to codeposition of copper and the encapsulating layer followed by plating, preferably electrolessly, only the encapsulating metal layer from the bath into the space at the top of the plug hole above the copper metal deposit and then after filling the plug hole, the plating continues until a small overgrowth has been formed.

Preferably, the encapsulating metal layer is composed of a noble metal, preferably selected from the group consisting of Pt, Pd, and Ag, and the encapsulating layer is then polished by a CMP process after the overgrowth.

Preferably, the diffusion barrier layer is composed of a refractory metal nitride selected from the group consisting of TiN, TaN and WN.

In accordance with another aspect of this invention, a device including a doped silicon semiconductor substrate has a substrate surface which is covered with an insulation layer in which a copper plug is formed in contact with the substrate surface. There is a plug hole in the insulation layer down to the substrate surface, the plug hole having walls and a bottom comprising a portion of the substrate surface. A diffusion barrier is formed on the walls and the bottom of the hole. A copper metal deposit partially fills the plug hole to a predetermined depth which is less than the depth "h" of the hole leaving a space in the plug hole above the copper metal deposit formed in situ with an encapsulating metal layer deposited on the surface of the copper metal deposit. The surface of the insulator layer had been polished to planarize the surface of the insulator layer which is the top surface of device to achieve coplanarity of metal layer with the topography of the insulator layer. Thus, the space at the top of the plug hole is covered with pure encapsulating metal at the top of the hole without any copper.

Preferably, the copper metal plug was deposited in situ to the predetermined depth less than the depth "h" was reached with a gradual transition of a codeposit of the copper metal and the encapsulating metal layer in the space in the plug hole above the copper metal deposit until only the encapsulating metal is present without any of the copper at the top of the plug hole.

Preferably the copper was deposited by plating, preferably in a plating bath, in an enclosed environment to the predetermined depth less than the depth "h" and gradually switched to a codeposit with the encapsulating metal layer into the space in the plug hole above the copper metal deposit until a small overgrowth of the metal layer has been formed above the plug hole.

The plating bath plates copper until the predetermined depth less than the depth "h" was reached with a gradual transition from of the constituents in the bath to plate the encapsulating metal layer from the bath.

Preferably, the copper metal deposit was plated from a plating bath in an electroless plating process.

Preferably, a gradual transition of the constituents in the bath to plate a codeposit of the copper and the encapsulating metal layer from the bath into the space in the plug hole to pure encapsulating metal at the top of the hole without any copper.

Preferably, the diffusion barrier layer is composed of a refractory metal nitride preferably selected from the group consisting of TiN, TaN and WN.

Preferably, the encapsulating metal layer is composed of a noble metal selected from the group consisting of Pt, Pd, and Ag.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

As semiconductor device dimensions are constantly being scaled down to the deep submicron regime, the current metallization scheme requires revision.

Figure 1:
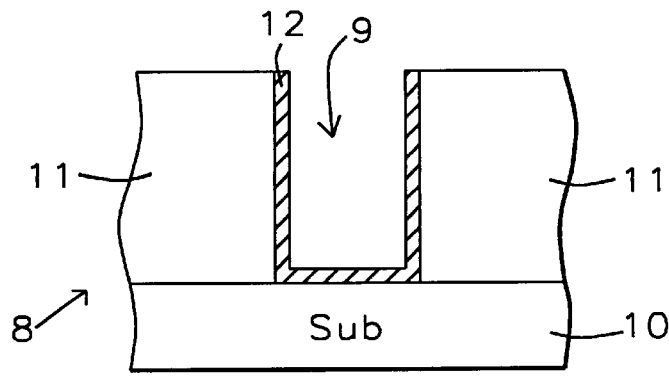
FIG. 1 shows a device in an early stage of manufacture formed on a single crystal silicon semiconductor substrate doped with N-type or P-type dopant which is covered with an insulation layer which has a plug (contact/via) hole formed therein down to the substrate surface with the walls and bottom of the hole coated with a diffusion barrier in accordance with this invention.

FIG. 1 shows a device 8 in an early stage of manufacture. Device 8 is formed on a single crystal silicon semiconductor substrate 10 doped with an impurity selected from a P-type dopant or an N-type dopant in accordance with this invention.

Form Insulator Layer on Semiconductor Substrate

First coat the semiconductor substrate 10 with an insulator layer 11 composed of a material selected from tetraorthosilicate (TEOS) based silicon dioxide ($SiO_2$), or $SiH_4$ based based silicon dioxide ($SiO_2$).

Form Contact/Via Hole in Insulator Layer

A plug (contact/via) hole 9 has been formed extending through the insulator layer 11 reaching through to the surface of the substrate 10 leaving walls of the insulator layer 11 and the portion of the surface of substrate 10 exposed at the bottom of the plug (contact/via) hole 9.

Form Diffusion Barrier on Surfaces of Contact/Via Hole

Then form a diffusion barrier layer 12 which coats the exposed surfaces of the contact/via hole 9 including the walls thereof in the insulator layer 11 as well as the exposed surfaces of the substrate 10 at the bottom of the contact/via hole 9. The diffusion barrier layer 12 is composed of a refractory metal nitride preferably selected from the group consisting of TiN, TaN and WN, i.e. nitrides of titanium, tantalum and tungsten. The refractory metal nitride diffusion barrier layer 12 is formed by the process of chemical vapor deposition (CVD), physical vapor deposition, or plasma enhanced chemical vapor deposition (PECVD).

Deposit Copper in Contact/Via Hole to Below Top

Figure 2:
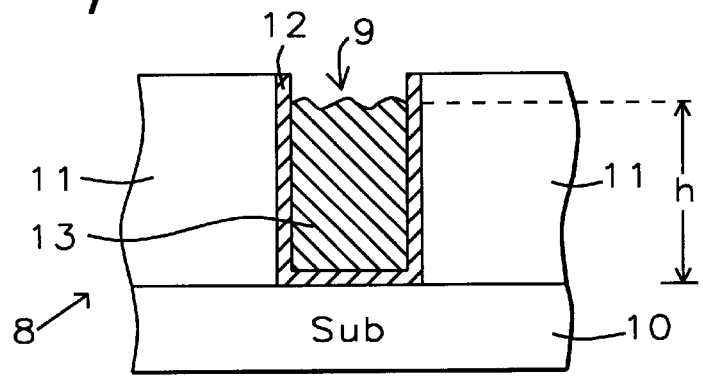
FIG. 2 shows the device of FIG. 1 after the plug (contact/via) hole has been partially filled with a copper metal deposit to the depth "h" which is less than the depth of the contact/via hole.
Figure 3:
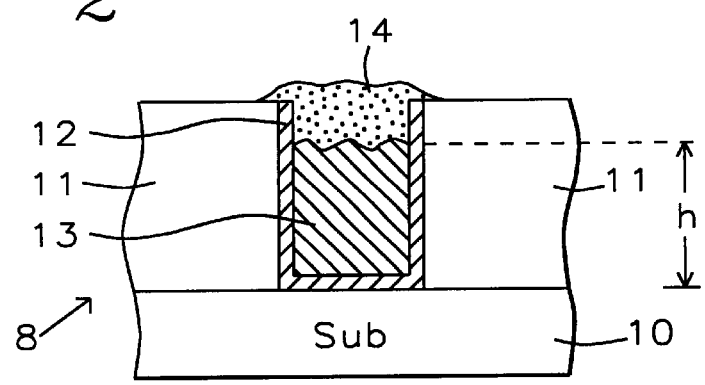
Referring to FIG. 3, the device of FIG. 2 is shown after copper metal deposit has reached the depth "h" in the plug hole. Then, the plating bath is gradually switched to deposit an encapsulating metal layer on the surface of the copper metal deposit.
Figure 4:
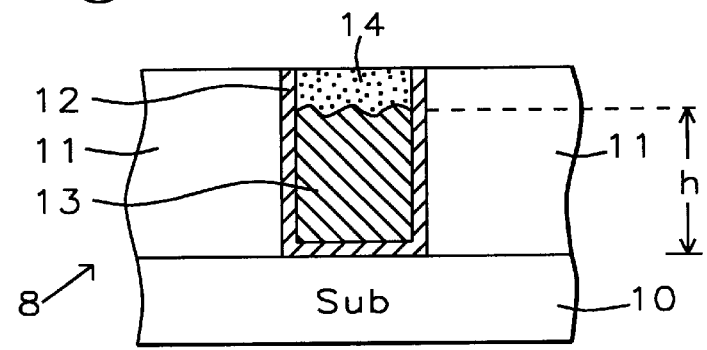
FIG. 4 shows the device of FIG. 3 after polishing the surface of the insulator layer removing the overgrowth of the metal layer shown in FIG. 3, and planarizing the surface of the insulator layer which is the top surface of device to achieve coplanarity of metal layer with the topography of the insulator layer.

FIG. 2 shows the device of FIG. 1 after the plug (contact/via) hole 9 has been partially filled with a copper metal via deposit 13, deposited to a depth that is shown as a via plug depth "h" in FIGS. 2–4 which, as can be seen in FIG. 2, is less than the hole depth of the plug hole 9. A process of electroless deposition of the copper in plug hole 9 on the exposed surfaces of the diffusion barrier-layer 12 is performed while performing precise monitoring of the growth rate of the copper metal via deposit 13.

Deposit Encapsulating Metal Capping Contact/Via Hole

Referring to FIG. 3, the device of FIG. 2 is shown after copper metal deposition of copper metal via deposit 13 in the plug hole 9 has reached the plug depth "h". Next follows a process of gradually switching the electroless plating bath to codeposit an encapsulating metal cap 14 comprising an interface composed of a mixture/alloy of an encapsulating metal with the quantity of copper decreasing in a gradual process of codeposition of a codeposit of less copper mixed with more of the conductive, encapsulating metal. The mixture/alloy codeposit of the metal with copper is covered by a deposit of the encapsulating metal alone forming an encapsulating metal cap 14 on the surface of the copper metal via plug 13 by an electroless process. The encapsulating metal in the metal cap 14 is composed of a noble metal preferably selected from the group consisting of Ag, Pt, and Pd and mixtures and alloys of metals in the aforesaid group. Thus on top of the copper metal via plug 13, there is the codeposit of copper covered on top by the encapsulation metal of the metal cap 14 which is composed of the encapsulating metal without any copper at the top of the contact/via hole 9. In summary, the copper metal deposit 13 is covered by a codeposit, i.e. a codeposited layer, of a copper/encapsulating metal mixture/alloy with a gradually increasing percentage of the encapsulating metal with the via plug being topped by the encapsulating metal 14.

Deposit Encapsulating Metal Above Top of Hole

Deposition of the encapsulating metal layer 14 on the surface of the insulator layer 11 continues until a small overgrowth of metal layer 14 occurs extending above the top of contact/via hole 9 as shown in FIG. 3.

Planarize Encapsulating Layer and Insulator Layer

FIG. 4 shows the device of FIG. 3 after polishing the surface of the insulator layer 11 removing the overgrowth of metal layer 14, and planarizing the surface of insulator layer 11 which is the top surface of device 8 to achieve coplanarity of metal layer 14 with the topography of insulator layer 11 thereby completing the in situ encapsulation of the copper metal deposit 13. The polishing is performed preferably by a CMP (Chemical Mechanical Polishing) step.

The present invention has several advantages as follows:
1. It allows immediate encapsulation of copper completely after deposition.
2. It enables such encapsulation to be done in situ thus minimizing processing time.
3. It allows selective encapsulation of copper immediately after deposition.
4. It acts as a sacrificial layer during a CMP process (i.e. minimizes dishing effect.)
5. Stopping layer for dry etching (i.e. Via patterning) eliminate Cu halide or Cu oxide formation on the bottom of the Via. Both Cu halide and Cu oxide will cause high via resistance.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A device including a doped silicon semiconductor substrate having a substrate surface which is covered with an insulation layer in which a copper plug is formed inside a diffusion barrier layer in contact with said substrate surface comprising:
   a plug hole formed through said insulation layer extending to said substrate surface, said plug hole having a hole depth, walls, a top, and a bottom comprising a portion of said substrate surface,
   the diffusion barrier layer being formed on said walls and on said substrate at said bottom of said plug hole leaving a remainder of the plug hole inside the diffusion barrier,
   a copper metal deposit partially filling the remainder of the plug hole inside the diffusion barrier in said plug hole as a copper metal via deposit reaching to a predetermined plug depth which is less than said hole depth leaving a space in said plug hole above said copper metal via plug,
   a codeposit having a bottom and a top surface composed of copper metal and an encapsulating noble metal formed in said plug hole on the surface of the copper metal via deposit,
   said codeposit of copper metal and said encapsulating noble metal formed above said copper metal via deposit including a gradual transition from only copper at the bottom of said codeposit to only the noble metal present without any copper at said top surface of said codeposit,
     an encapsulating metal cap layer composed of said encapsulating noble metal deposited at the top of said plug hole, on top surface of said codeposit, and
     said encapsulating metal cap layer having been planarized with the surface of the insulator layer which is the top surface of device providing coplanarity of said encapsulating metal cap layer with the topography of said insulator layer.

2. The device of claim 1
   with a copper metal via plug formed on a doped silicon substrate surface, and
   with said diffusion barrier layer being composed of a refractory metal nitride.

3. The device of claim 1 with said diffusion barrier layer being composed of a refractory metal nitride selected from the group consisting of TiN, TaN and WN.

4. The device of claim 1 with
   said diffusion barrier layer being composed of a refractory metal nitride selected from the group consisting of TiN, TaN and WN, and
   said encapsulating metal layer being a polished and planarized layer composed of a metal selected from the group consisting of Pt, Pd, and Ag.

5. A device including a doped silicon semiconductor substrate having a substrate surface which is covered with an insulation layer in which a copper plug is formed inside a diffusion barrier layer in contact with said substrate surface comprising:
   a plug hole formed through said insulation layer extending to said substrate surface, said plug hole having a hole depth, walls, a top, and a bottom comprising a portion of said substrate surface,
   the diffusion barrier layer being formed on said walls and on said substrate at said bottom of said plug hole leaving a remainder of the plug hole inside the diffusion barrier,
   a copper metal deposit partially filling the remainder of said plug hole inside said diffusion barrier in said plug hole as a copper metal via deposit reaching to a predetermined plug depth which is less than said hole depth leaving a space in said plug hole above said copper metal via plug,
   a codeposit of copper metal and a mixture/alloy of an encapsulating noble metal formed in said plug hole over said copper metal via deposit with said codeposit including a gradual transition from copper metal alone to an alloy/mixture of said encapsulating noble metal with copper to said mixture/alloy of said encapsulating noble metal without any copper,
   a metal cap layer composed of said mixture/alloy of said encapsulating noble metal deposited over said codeposit,
   said codeposit and said metal cap layer filling said space in said plug hole over said copper metal via plug, and
   said cap having been planarized with the surface of the insulator layer which is the top surface of device providing coplanarity of said encapsulating metal cap with the topography of said insulator layer.

6. The device of claim 5
   with a copper metal via plug formed on a doped silicon substrate surface, and
   with said diffusion barrier layer being composed of a refractory metal nitride.

7. The device of claim 5 with said diffusion barrier layer being composed of a refractory metal nitride selected from the group consisting of TiN, TaN and WN.

8. The device of claim 5 with
   said diffusion barrier layer being composed of a refractory metal nitride selected from the group consisting of TiN, TaN and WN, and
   said encapsulating metal layer being a polished and planarized layer composed of a metal selected from the group consisting of Pt, Pd, and Ag.

\* \* \* \* \*